United States Patent
Huang et al.

(10) Patent No.: US 8,476,629 B2
(45) Date of Patent: Jul. 2, 2013

(54) ENHANCED WAFER TEST LINE STRUCTURE

(75) Inventors: Jiun-Jie Huang, Kaohsiung (TW); Chi-Yen Lin, Tainan (TW); Ling-Sung Wang, Tainan (TW)

(73) Assignee: Taiwan Semiconductor Manufacturing Company, Ltd., Hsin-Chun (TW)

( * ) Notice: Subject to any disclaimer, the term of this patent is extended or adjusted under 35 U.S.C. 154(b) by 0 days.

(21) Appl. No.: 13/246,536

(22) Filed: Sep. 27, 2011

(65) Prior Publication Data

US 2013/0075725 A1 Mar. 28, 2013

(51) Int. Cl.
*H01L 29/788* (2006.01)
*H01L 27/12* (2006.01)

(52) U.S. Cl.
USPC ........... 257/48; 438/5; 438/459; 438/798; 438/455; 438/526; 257/E29.251; 257/E26.25

(58) Field of Classification Search
USPC .......... 438/14–18; 257/48, E21.525, E23.002
See application file for complete search history.

(56) References Cited

U.S. PATENT DOCUMENTS

| | | | | |
|---|---|---|---|---|
| 5,659,202 A | * | 8/1997 | Ashida | 257/758 |
| 6,084,256 A | * | 7/2000 | Nakata | 257/211 |
| 6,436,614 B1 | * | 8/2002 | Zhou et al. | 430/321 |
| 6,794,276 B2 | * | 9/2004 | Letertre et al. | 438/506 |
| 6,921,914 B2 | * | 7/2005 | Cheng et al. | 257/19 |
| 7,102,524 B2 | * | 9/2006 | Arneson et al. | 340/572.8 |
| 7,176,108 B2 | * | 2/2007 | Cayrefourcq et al. | 438/458 |
| 7,782,073 B2 | | 8/2010 | Lo et al. | |
| 7,974,728 B2 | | 7/2011 | Lin et al. | |
| 2006/0289997 A1 | * | 12/2006 | Tomita | 257/758 |
| 2011/0304349 A1 | * | 12/2011 | Stillman et al. | 324/756.02 |

\* cited by examiner

*Primary Examiner* — Marcos D. Pizarro
*Assistant Examiner* — Steven H Assadi
(74) *Attorney, Agent, or Firm* — Haynes and Boone, LLP

(57) ABSTRACT

A semiconductor wafer has a die area and a scribe area. A first dummy pad is formed in a first test line area of the scribe area and filled with a first material as part of a first metal layer. A first interlayer dielectric is formed over the first metal layer. A first interconnect pattern is formed in the die area and above the first interlayer dielectric, and a first trench pattern is formed in the first test line area of the scribe area and above the interlayer dielectric. The first interconnect pattern and the first trench pattern are filled with a second metal layer, and the first trench pattern is aligned above the first dummy pad. An enhanced test line structure including the first trench pattern and the first dummy pad is formed and probed in a back end of line (BEOL) process.

20 Claims, 3 Drawing Sheets

ENHANCED WAFER TEST LINE STRUCTURE

BACKGROUND

In integrated circuit (IC) manufacturing, a semiconductor wafer typically contains a plurality of test line structures in the scribe line area between adjacent wafer dies. Each test line structure includes one or more test devices, which are devices similar to those that are normally used to form the integrated circuit products in the wafer die area. By studying the test line structures, it is possible to monitor, improve, and refine a semiconductor manufacturing process.

With the continuing scale-down of IC device feature sizes, integrated circuit device density and functional complexity are continuously increasing. This trend imposes new challenges on the existing test line structures and test methodologies. One of these challenges is to test such parameters as sheet resistance (Rs), critical dimension (CD) and thickness of Cu trench structures.

SUMMARY

The present disclosure provides methods and devices for providing an enhanced wafer test line structure. In one embodiment, a method includes receiving a semiconductor wafer having a die area and a scribe area. A first dummy pad is formed in a first test line area of the scribe area and filled with a first material as part of a first metal layer. For example, the first metal layer can be a Cu layer. A first interlayer dielectric is formed over the first metal layer. A first interconnect pattern is formed in the die area and above the first interlayer dielectric, and a first trench pattern is formed in the first test line area of the scribe area and above the interlayer dielectric. The first interconnect pattern and the first trench pattern are filled with a second metal layer, and the first trench pattern is aligned above the first dummy pad. As in the previous example, the second metal layer can be a Cu layer. As a result, an enhanced test line structure including the first trench pattern and the first dummy pad is formed.

In some embodiments, the enhanced test line structure is probed in a back end of line (BEOL) process, for measuring such parameters as thickness and critical dimensions of the first trenches.

The present disclosure also describes semiconductor wafers with enhanced test line structures. In one embodiment, a semiconductor wafer includes a die area and a scribe area. A first metal layer is provided, including a first dummy pad in the scribe area. A first dielectric layer overlies the first metal layer. A second metal layer overlies the first dielectric layer, the second metal layer including a first interconnect in the die area and a first test line structure in the scribe area. The first test line structure overlies and is aligned with the first dummy pad.

The present disclosure also describes integrated circuit devices with enhanced test line structures. In one embodiment, an integrated circuit device includes a die area surround by a die seal, and a scribe area outside of the die seal. A first patterned metal layer including at least a portion of a first dummy pad in the scribe area. A first dielectric layer overlies the first metal layer. A second patterned metal layer overlies the first dielectric layer, the second patterned metal layer includes a first interconnect in the die area and at least a portion of a first test line structure in the scribe area. The portion of the first test line structure overlies and is aligned with the portion of the first dummy pad.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that specific embodiments are provided herein as examples to teach the broader inventive concept, and one of ordinary skill in the art can easily apply the teaching of the present disclosure to other methods or apparatus. In addition, it is understood that the methods, devices, and apparatus discussed in the present disclosure include some conventional structures and/or processes. Since these structures and processes are well known in the art, they will only be discussed in a general level of detail. Some intermediate structures and/or processes may be left out of the present description, their inclusion being merely a matter of design choice. Furthermore, reference numbers are repeated throughout the drawings for sake of convenience and example, and such repetition does not indicate any required combination of features or steps throughout the drawings.

The present disclosure is directed to a test line structure for wafer acceptance testing (WAT). The embodiments of the invention include the test line structure and testing methodology using the test line structure. This may also benefit other R&D activities, such as yield analysis, design-of-experiment (DOE), statistical split, and customized user test key input, among others.

Figure 1:
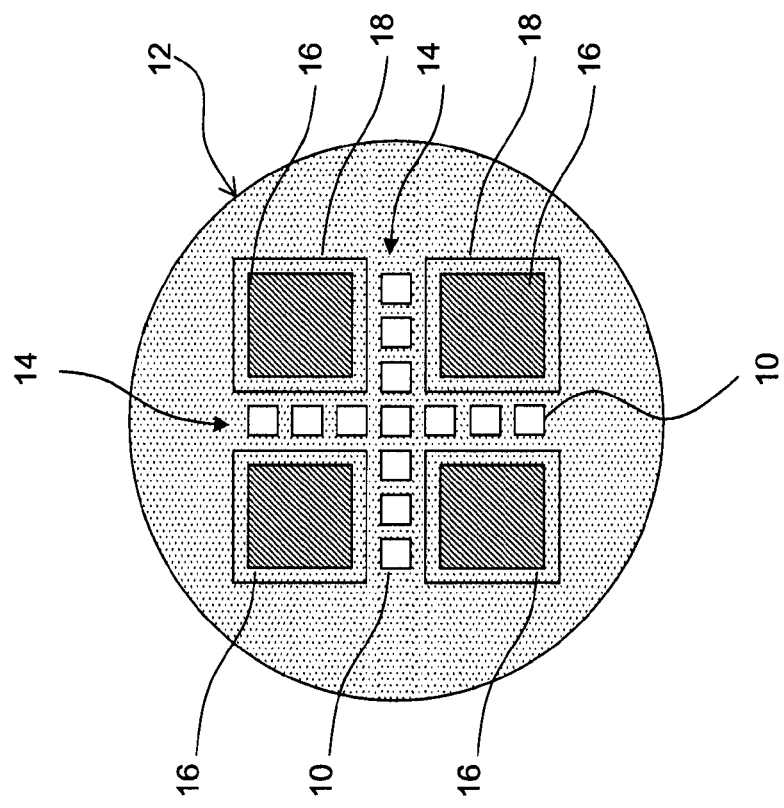
FIG. 1 is a top view of a semiconductor wafer upon which one or more embodiments of the present invention can be implemented.

FIG. 1 illustrates a plan view of test line structures 10 formed on a semiconductor wafer 12. The semiconductor wafer 12 includes a plurality of scribe line areas 14 between adjacent wafer dies 16. The test line structures 10 are placed in the scribe line areas 14, and can be used for tests or other functions, as discussed below. Each test line structure 10 includes one or more test pads, such as WAT array pads and optical critical dimension (OCD) pads. In the present embodiment, each die 16 includes a die seal 18 so that when the semiconductor wafer 12 is provided to assembly, each die is accordingly protected.

Figure 2:
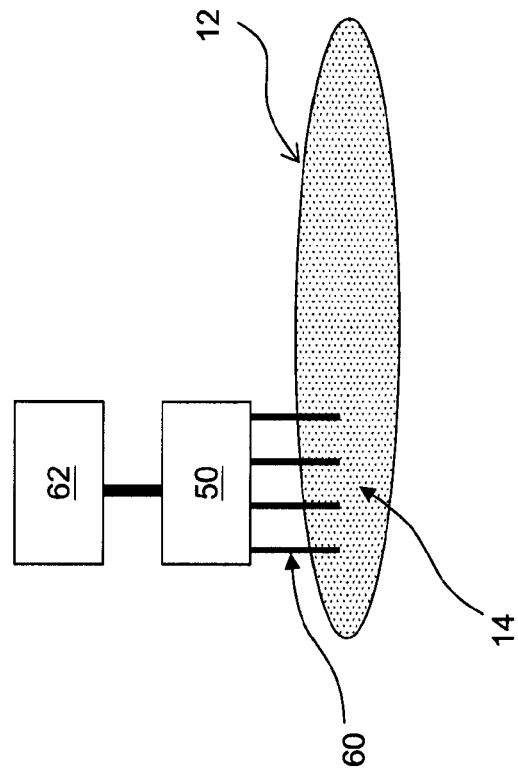
FIG. 2 is a side, perspective view of the semiconductor wafer of FIG. 1, in which one or more test lines structures are being tested.

FIG. 2 shows a probe card 50 used in a parametric test. The probe card 50 includes a plurality of probes 60. It is understood that there are many types of probes 60, such as electrical probe pins, optical probes, and/or magnetic probes. The probe card 50 sequentially and repeatedly applies test signals to and receives responses from the test line structure(s) through the probes 60. The probe card 50 is usually connected to a testing apparatus (tester) 62 where test stimuli (programs) are installed and test results may be recorded. In a Back End of Line (BEOL) test, the test line structures can ensure process stability on various parameters. Upon finishing tests, failed dies are inked and/or faulty process results are identified. The wafer 12 is then diced along the scribe lines 14 and thus integrated circuit devices (chips) are created.

In the present example, the semiconductor wafer substrate 12 uses a copper metal structure for interconnecting circuitry on the various wafer dies 16. The copper metal structure includes a plurality of metal layers, e.g., five, separated by one or more layers of interlayer dielectric. For each layer, a dielectric layer is etched with a pattern, copper is deposited over the patterned dielectric layer, and a top portion of the deposited copper is removed by a chemical mechanical planarization (CMP) process. The overall process can be used to not only make the metal interconnects, but a dual damascene process can be used to further make vias and other interlayer connections. It is understood that the various layers can be of other materials, such as copper alloy and/or aluminum.

In the present example, it is desired that the thickness and width of the copper interconnects be of the proper size to insure such things as reliability and a proper sheet resistance Rs. Therefore, the test line structures 10 can provide structures by which these measurements can be made outside of the die.

Figure 3:
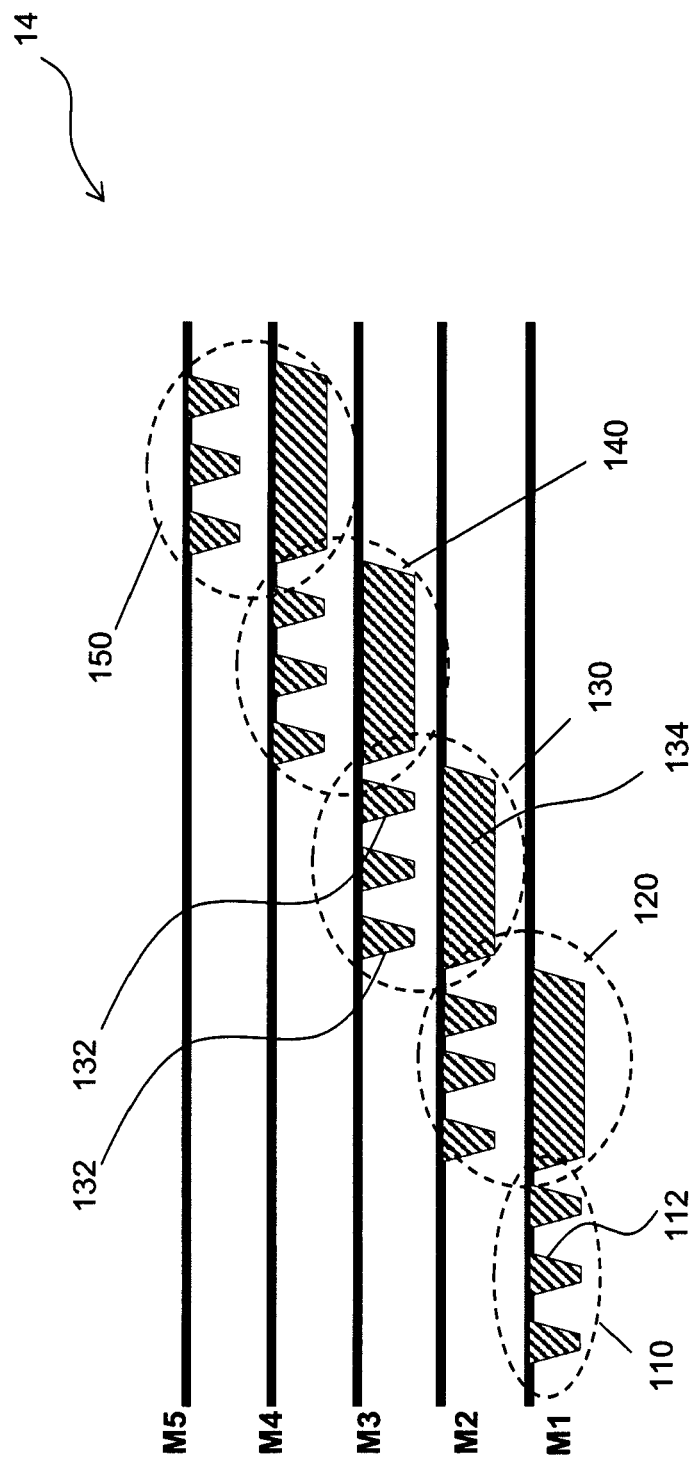
FIG. 3 is a side cross-sectional view of a scribe line area of the semiconductor wafer of FIG. 1, including multiple test line structures according to various embodiments of the present invention.

FIG. 3 shows a cross-sectional view of a portion of the scribe line area 14 in which one or more test line structures are provided. Continuing with the example above, the cross section shows five metal layers with surrounding dielectric material, each with a test line structure, as in the test line structures 10 of FIG. 1. The test line structures are shown with a dotted circle 110, 120, 130, 140, and 150 in the figures. The test line structure 110 is located on metal 1 (M1) and includes three trenches 112. The test line structure 130 is located in metal layers 2 and 3 (M2 and M3) and includes three trenches 132 in M3 and a dummy pad 134 in M2. In the present example, the dummy pad 134 is solid and directly under the three trenches 132, as shown in the figure. The test line structures 120, 130, 140, and 150 are all similar, in that they all include a plurality of trenches and a dummy pad in the underlying layer.

The trenches 112, 132 in each of the test line structures are formed at the same time, and with similar dimensions, as corresponding trenches in the die. This allows the trenches 112, 132 in the scribe are to be used to monitor the corresponding trenches in the die.

Figure 4:
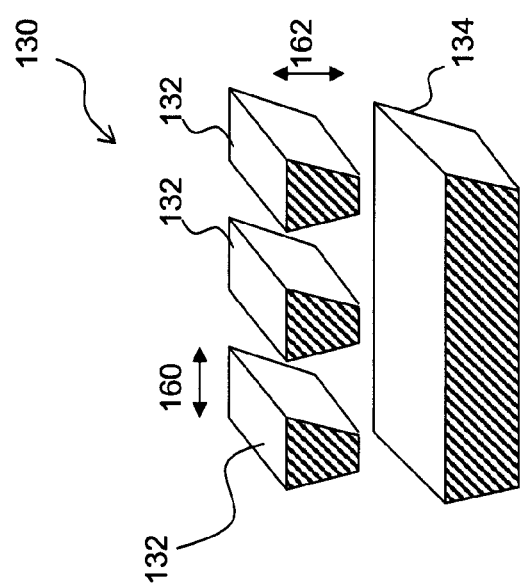
FIG. 4 is a side, perspective view of a test line structure of the semiconductor wafer of FIG. 1, according to one embodiment of the present invention.

Referring to FIG. 4, the dummy pad 134 is a solid pad that is added for the sake of facilitating a critical dimension 160 and a thickness measurement 162 of each of the trenches 132. This allows an optical metrology tool, such as a Nova brand tool, to measure these parameters with a very high degree of accuracy. Although the dummy pad 134 may be formed at the same time as other trenches are formed in the same metal layer, it is not restricted to be of corresponding dimensions as the other trenches. In the present embodiment, each test line structure includes three trenches 132 in parallel, and the underlying dummy pad 134 is solid and spans the overall width of the three trenches. The dummy pad 134 may not be measured itself, but is instead used to facilitate the measurement of the trenches immediately above it. By using the dummy pads 134, the measurements of the trenches 132 become more accurate, so that the corresponding sheet resistance Rs for these trenches is a highly accurate indication of the Rs of the trenches in the dies 16.

Figure 5:
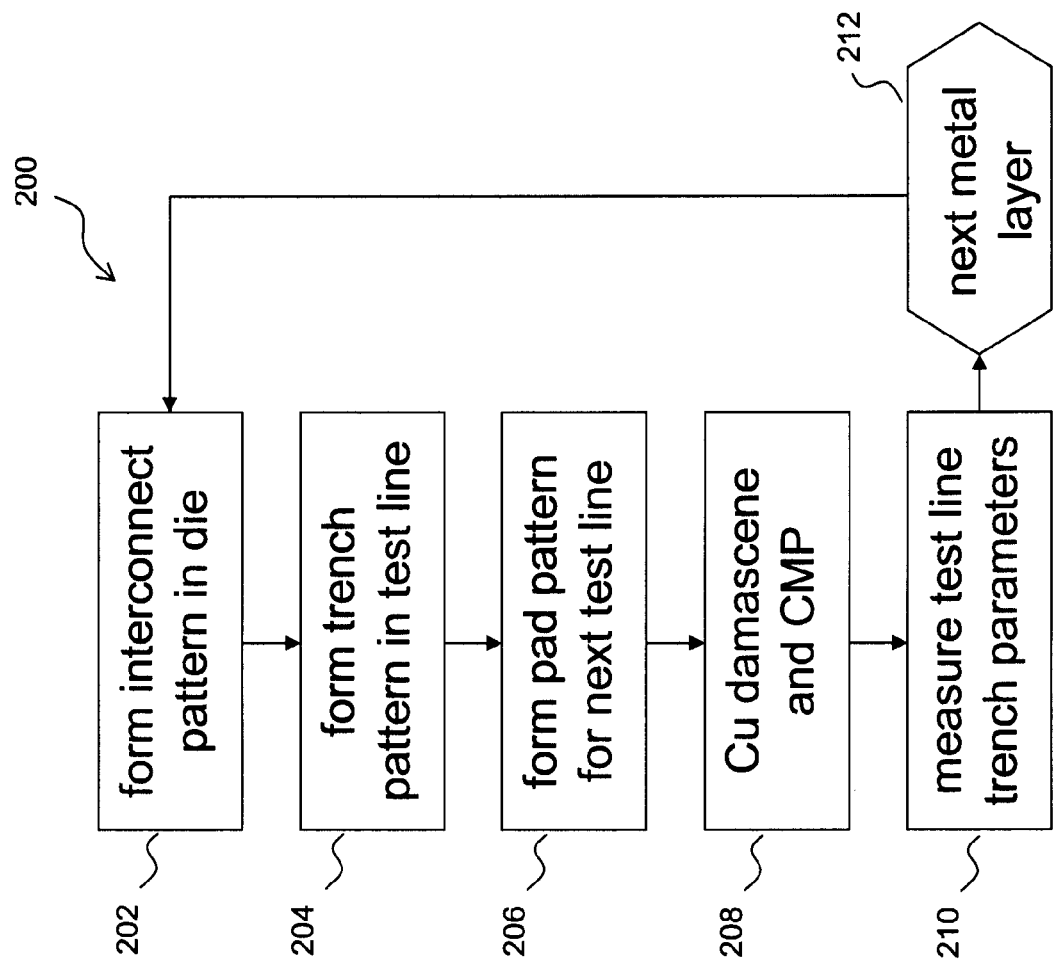
FIG. 5 is a flow chart of one embodiment of a method for making the semiconductor wafer of FIG. 1, and corresponding integrated circuit devices.

Referring to FIG. 5, a method 200 can be used for forming an enhanced test line structure in the scribe area of a semiconductor wafer, such as the test line structures 10 of FIG. 1 and structures 120, 130, 140, and 150 of FIGS. 3-4. In the present embodiment, the semiconductor wafer has already completed front end of line processing, and is now at the back end of the fab.

The method 100 begins at step 202 where an interconnect pattern is formed on the dies in the semiconductor wafer. Continuing with the example above, a damascene process is used, in which trenches and other openings are created in a dielectric layer, in a die area of the semiconductor wafer. At step 204, a trench pattern is formed in a test line in the dielectric layer, in a scribe area of the semiconductor wafer. The trench pattern will be formed in a dielectric layer, similar to (e.g., made by the same process as) the dielectric layer in the die area. In the present embodiment, the trench pattern formed in the test lines are sized the same as the interconnect patterns. That is, they have approximately the same thickness, and the same minimal CD.

At step 206, a dummy pad is also formed in dielectric layer of the test line. The dummy pad is positioned to correspond with a later trench pattern to be formed in a subsequent process. At step 208, a Cu damascene and CMP process is completed whereby the interconnect patterns in the die area, and the trenches and dummy pad in the test line, are filled with Cu.

At step 210, various parameters of the test line are probed and measured. As discussed above, the Cu-filled trenches in the test line of the specific metal layer overly a previously formed dummy pad in an underlying metal layer. As a result, the measurements of the trenches are much more accurate, than without the underlying dummy pad.

At step 212, the method repeats for a next metal layer, until all the layers (or all the desired layers) to receive a dummy pad have been formed. In the present example, an intermetal dielectric is formed above the Cu-filled trenches, interconnects and dummy pad(s). Then a next metal layer is formed by forming a dielectric layer and then patterning the dielectric layer according to steps 202-206.

Although only a few exemplary embodiments of this invention have been described in detail above, those skilled in the art will readily appreciate that many modifications are possible in the exemplary embodiments without material departing from the novel teachings and advantages of this disclosure. Also, the claims below use terms like "first" and "second," which are used for designators in the claim. For example, a "first metal layer" is not limited to reading on metal one (M1).

What is claimed is:

1. A method comprising:

receiving a semiconductor wafer having a die area and a scribe area;

forming a first dummy pad in a first test line area of the scribe area;

filling the first dummy pad with a first material as part of a first metal layer;

forming a first interlayer dielectric over the first metal layer;

forming a first interconnect pattern in the die area and above the first interlayer dielectric;

forming a first trench pattern in the first test line area of the scribe area and above the interlayer dielectric, wherein the first trench pattern is aligned above the first dummy pad; and filling the first interconnect pattern and the first trench pattern as part of a second metal layer;
whereby the first trench pattern and the first dummy pad form an enhanced test line structure.

2. The method of claim 1, further comprising:
forming a second trench pattern in a second test line area of the scribe area; and
filling the second trench pattern with the first material as part of the first metal layer.

3. The method of claim 1, further comprising:
forming a second dummy pad in a third test line area of the scribe area; and
filling the second dummy pad with the second material as part of the second metal layer.

4. The method of claim 1, further comprising:
probing the first trenches of the first test line area.

5. The method of claim 4, wherein the probing includes measuring a thickness of the first trenches.

6. The method of claim 4, wherein the probing includes measuring a critical dimension of the first trenches.

7. The method of claim 4, wherein the probing utilizes an optical probe.

8. The method of claim 1, wherein the first metal layer includes copper, the method further comprising:
polishing the first metal layer after filling.

9. The method of claim 1, wherein the first dummy pad is formed and filled as part of a damascene process.

10. A semiconductor wafer comprising:
a die area and a scribe area;
a first metal layer including a first dummy pad in the scribe area;
a first dielectric layer overlying the first metal layer; and
a second metal layer overlying the first dielectric layer, the second metal layer including a first interconnect in the die area and a first trench pattern in the scribe area, the first trench pattern overlying and aligned with the first dummy pad.

11. The semiconductor wafer of claim 10, wherein the second metal layer further comprises a second dummy pad.

12. The semiconductor wafer of claim 11, further comprising:
a second dielectric layer overlying the second metal layer; and
a third metal layer overlying the second dielectric layer, the third metal layer including a second interconnect in the die area and a second trench pattern in the scribe area, the second trench pattern overlying and aligned with the second dummy pad.

13. The semiconductor wafer of claim 10, wherein the first and second metal layers each include Cu.

14. The semiconductor wafer of claim 13, wherein the first dummy pad, the first interconnect and the first trench pattern are all formed by a damascene process.

15. The semiconductor wafer of claim 11, wherein the first trench pattern includes a plurality of trenches and the first dummy pad is a solid pad with a width that spans the plurality of trenches.

16. An integrated circuit device comprising:
a die area surround by a die seal, and a scribe area outside of the die seal
a first patterned metal layer including at least a portion of a first dummy pad in the scribe area, wherein the first dummy pad forms a first portion of a first test line structure;
a first dielectric layer overlying the first metal layer in the scribe area; and
a second patterned metal layer overlying the first dielectric layer, the second patterned metal layer including a first interconnect in the die area and at least a second portion of the first test line structure in the scribe area, the second portion of the first test line structure overlying and aligned with the first portion of the first test line structure that includes first dummy pad.

17. The integrated circuit device of claim 16, wherein the second metal layer further comprises at least a portion of a second dummy pad that is not a part of the first test line structure, wherein the second dummy pad forms a first portion of a second test line structure.

18. The integrated circuit device of claim 17, further comprising:
a second dielectric layer overlying the second metal layer; and
a third metal layer overlying the second dielectric layer, the third metal layer including a second interconnect in the die area and at least a second portion of the second test line structure in the scribe area, the second portion of the second test line structure overlying and aligned with the first portion of the second test line structure that includes second dummy pad.

19. The integrated circuit device of claim 16, wherein the first and second metal layers each include Cu.

20. The integrated circuit device of claim 19, wherein the first dummy pad is a solid pad, and the second portion of the first test line structure includes a plurality of trenches.

* * * * *